United States Patent
Liang

Patent Number: 5,577,616
Date of Patent: Nov. 26, 1996

[54] CUSHIONING PACKAGE FOR TRANSPORTING OR STORING SEMICONDUCTOR WAFERS

[75] Inventor: Wen-Sheng Liang, Hsin-Chu, Taiwan

[73] Assignee: Taiwan Semiconductor Manufacturing Company Ltd., Hsin-Chu, Taiwan

[21] Appl. No.: 652,211

[22] Filed: May 23, 1996

[51] Int. Cl.$^6$ ................................................ B65D 85/30
[52] U.S. Cl. .......................... 206/710; 206/593; 206/594
[58] Field of Search ............................ 206/701, 710, 206/521, 523, 585, 591, 593, 594

[56] References Cited

U.S. PATENT DOCUMENTS

| | | | |
|---|---|---|---|
| 4,399,039 | 7/1982 | Mykleby | 206/594 X |
| 4,836,379 | 6/1989 | Shaw | 206/591 X |
| 5,366,079 | 11/1994 | Lin et al. | 206/328 |
| 5,395,007 | 3/1995 | Housholdes et al. | 206/594 X |

Primary Examiner—Jacob K. Ackun
Attorney, Agent, or Firm—George O. Saile; William S. Robertson

[57] ABSTRACT

A cushioned holder for a cylindrical container for a semiconductor wafer is formed of a stack of layers of a cushioning material that each have a rectangular opening for receiving the container; the layers are spaced from the box by several absorbers having a mirrored pyramidal frustum shape. The shape is easy to manufacture and it provides improved cushioning without increasing the space occupied by the layers.

11 Claims, 1 Drawing Sheet

5,577,616

CUSHIONING PACKAGE FOR TRANSPORTING OR STORING SEMICONDUCTOR WAFERS

FIELD OF THE INVENTION

This invention relates to a receptacle or package for holding a semiconductor wafer for storage or transport between steps in manufacturing the wafer. More specifically the invention relates to a cushion that is placed between a wafer container and a box that holds the container and the cushion material.

INTRODUCTION

During part of the process for manufacturing semiconductor chips, the semiconductor is in the form of a circular wafer that is several inches in diameter. Since these wafers are thin and fragile, a protective container is used for storing and transporting them. Because wafers are being made thinner, providing a suitable container has become a more difficult problem. (After an operating to grind the backside of the wafer, the wafer thickness is on the order of a third of a millimeter.)

THE PRIOR ART

U.S. Pat. No. 5,366,079 discloses a container for wafers. The container has a cylindrical body 10 and it holds a stack of several wafers. Cushion elements 52 are located inside the container to separate the wafers.

Cylindrical wafer containers of various types are commonly held in an outer box-like structure made of hard paper, and a cushioning material is placed between the wafer container and the box. The cushioning material has been made of sponge.

This cushioning material is formed into layers of two shapes that are stacked around a cylindrical container and above and below it. One shape is a frame layer about 7.5 centimeters thick. Each frame layer has a rectangular opening that is large enough to easily receive a cylindrical container, and a stack of these layers is formed around the container. (Some packages use rectangular frames with two openings.) The other shape is a solid rectangle about 5 centimeters thick that is located at the top and bottom of the stack.

A stack with a top layer, a bottom layer and several intermediate layers is protected by a box that is commonly made of heavy paper.

SUMMARY OF THE INVENTION

A general object of this invention is to provide a new and improved stackable cushion for a wafer container holder.

A more specific object of the invention is to provide a stackable cushion that can be manufactured easily from a soft material. The preferred material is expanded polypropylene (EPP). The softness of a material can be stated in terms of the possible volume change as the material is compressed from its normal volume to a unit volume. The softness of EPP is represented by an original volume on the order of 30 to 50 times the unit volume.

Another advantage of EPP, as compared with previously used materials, is that the stackable cushion can be used several times. (The previous packing was used only once.)

The cushion material is formed as layers that are stackable around the wafer container with a solid top layer, a solid bottom layer and intermediate frame shaped layers. These layers fit around the wafer container in the general way described for the prior art.

In this improved cushion, the outer edges of each frame layer are spaced from the inside walls of the box, and they carry outwardly extending absorbers that extend to the inner wall of the container and position the intermediate layer laterally in the box. The absorbers are integral with the rest of the frame layer.

The absorbers are given an advantageous shape. Each absorber has, in part, the shape of a pyramid with its top cut off (in concept) to form a small rectangular surface, parallel to the larger rectangular base of the original pyramid. Such a figure is known as a pyramidal frustum. Two such elements are joined at the smaller of their two parallel rectangular surfaces so that the structure is symmetrical about the plane of the smaller rectangle. (The structure also has the four-fold rotational symmetry of a simple pyramid.) The absorber shape will be called a mirrored pyramidal frustum shape.

An absorber is narrow at the center where the four planes of the sides of the frustum meet and it is wide where the absorber joins the frame member and wide where the absorber abuts the inside wall of the box. This shape allows the absorber to deform easily when a force is applied against it.

The flat surfaces of the mirrored pyramidal frustum absorber make it easy to manufacture by readily understood manufacturing techniques.

Other features and advantages of the invention will be apparent from the description of a preferred embodiment.

THE DRAWING

FIG. 1 is a top view of an intermediate layer of the wafer container holder of this invention and the box it is carried in.

THE PREFERRED EMBODIMENT

Introduction

Figure 1:
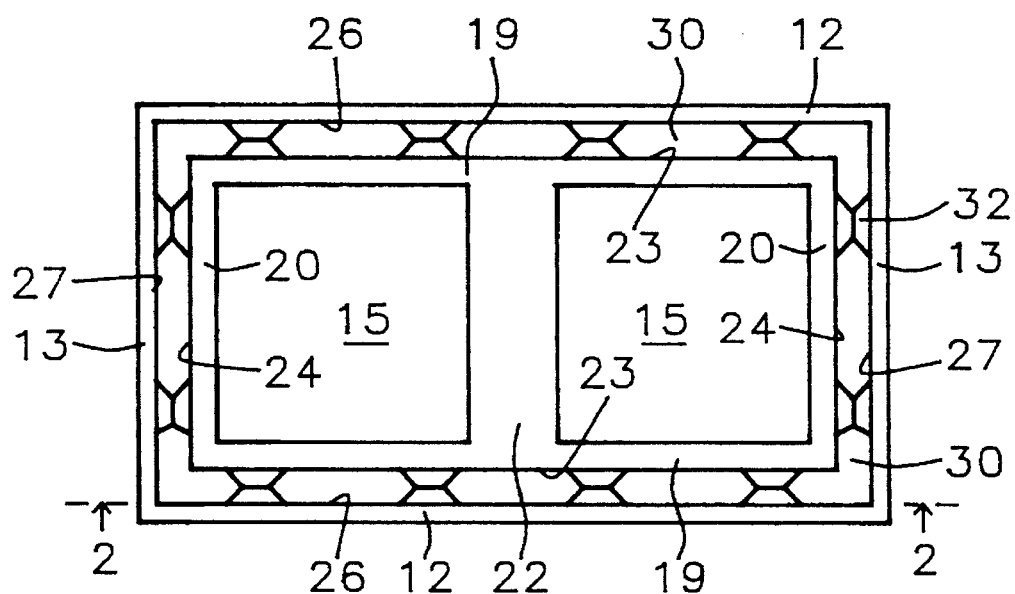

FIG. 1 shows the opposite long edges 12 and short edges 13 of the sides of a box 14 that holds two wafer containers (not shown) and the stackable cushion of this invention. The box has any suitable construction to hold the wafer containers and the cushion material, and it may be constructed as in the prior art. Besides the sides 13, 14 shown in FIG. 1, the box has a conventional bottom surface 18 shown in FIG. 2 and a top that is similar to the bottom and is not shown. Feet 17 are formed on the bottom of the box.

The Intermediate Frame Layer

FIG. 1 represents the package with the box opened at the top and the solid rectangular top cushion layer and the two wafer containers removed. The top most frame layer 16 can be seen. It has long side members 19, short side members 20, and a mid member 22. These elements form two openings 15 in the frame layer. Frame layer 16 is preferably made of a layer of EPP and may have the thickness of the prior art. The solid rectangular bottom layer (21 in FIG. 2) of the cushion lies below the stack of frames and can be seen through openings 15.

The outer edges 23, 24 of a frame 16 are separated from the corresponding surfaces 26, 27 of box walls 12 and 13 by a space 30. Absorber elements 32 are shaped to span space 30 and to yielding hold the frame layer 16 in position in box 14.

Figure 2:
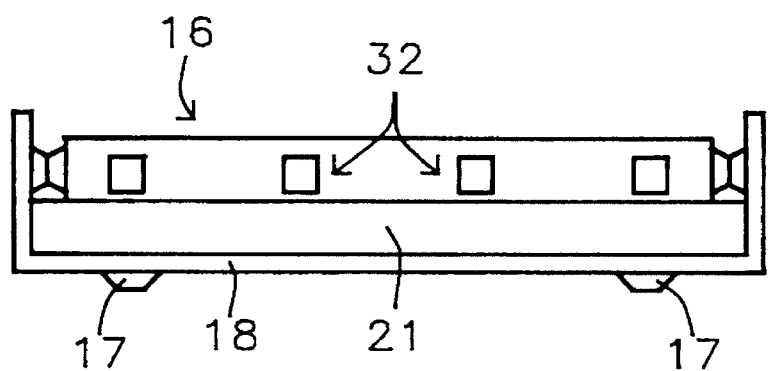
FIG. 2 is an edge view of the structure of FIG. 1 along section line 2—2.

As FIGS. 1 and 2 together show, an absorber has a mirrored pyramidal frustum shape. Both Figs show the inner and out pyramidal frustums 33 and 34 and their mirror combination. This shape gives the layer improved force absorbing qualities, as explained earlier.

FIG. 2 shows four absorber elements along the long side of the rectangular frame and two absorber elements along the short side. The corresponding frame for a single wafer container preferably has two absorbers on each side. The preferred spacing represented in the drawing corresponds to a wafer container with a diameter in the range of 20 to 25 centimeters and adaptations for wafer containers of other sizes will be readily understood.

Assembling the Box and the Stackable Layers

A box is located in a convenient position and the solid rectangular bottom layer is placed in the bottom of the box. Then the wafer containers are placed in the box on the bottom layer. Then intermediate layers are stacked around the wafer containers to the level of the top of the container. The top layer is put in place to complete the stack, and the box is closed. Additional top and bottom layers can be used if required by the size of the box.

Other Embodiments

From the description of the preferred embodiment of the invention and suggested variations, those skilled in the art will recognize adaptations within the skill of the art and the intended scope of the claims.

I claim:

1. A stackable cushion formed in layers adapted to be stacked inside a box (14) to enclose a fragile object within a solid rectangular space, one layer (21) being adapted to form a bottom supporting layer and having a substantially unbroken supporting surface, wherein the improvement comprises, a frame layer (16) having a flat upper and lower surface and forming a rectangular opening (15) for enclosing the fragile object, the frame layer having vertical edges (23, 24) parallel to the edges of the box when the cushion is assembled in the box, and absorbers (32) extending from selected positions along the vertical edges of the frame to engage the inside wall (26, 27) of the box, each absorber having a mirrored pyramidal frustum shape with the smaller of the two parallel surfaces of each frustum joined and one of the two larger surfaces adjoining a vertical edge of the frame and the other of the two larger surfaces abutting the inside wall of the box in an assembled cushion.

2. The stackable cushion of claim 1 wherein the pyramidal frustum shape has four trapezoidal surfaces and the parallel surfaces of each frustum are square.

3. The stackable cushion of claim 2 wherein the supporting bottom layer extends to the inside walls of the box.

4. The stackable cushion of claim 3 wherein the assembled layers include a single bottom layer and a similar single top layer.

5. The stackable cushion of claim 3 wherein the frame layer material has a softness in the range of 30 to 50 as measured by the ratio of compression from an original volume to a unit volume.

6. The stackable cushion of claim 3 wherein the fragile object is a container for semiconductor wafers.

7. The stackable cushion of claim 6 wherein the frame layer material is polypropylene.

8. The stackable cushion of claim 7 wherein the cushion is reusable.

9. The stackable cushion of claim 8 wherein the frame layers are a few millimeters thick.

10. The stackable cushion of claim 9 wherein the frame layer is stackable around two wafer containers and the frame layer has members forming a long side (19) and a short side (20).

11. The stackable cushion of claim 9 wherein the frame layer has four mirrored pyramidal frustum shaped absorbers along each long side and two mirrored pyramidal frustum shaped absorbers along each short side.

* * * * *